（12） United States Patent
Antaya et al.

(10) Patent No.: US 8,222,523 B2
(45) Date of Patent: *Jul. 17, 2012

(54) BUSS BAR STRIP

(75) Inventors: Stephen C. Antaya, West Kingston, RI (US); Manuel H. Machado, Hope, RI (US); Matthew Jarod Scherer, Kingston, RI (US)

(73) Assignee: Antaya Technologies Corporation, Cranston, RI (US)

( * ) Notice: Subject to any disclaimer, the term of this patent is extended or adjusted under 35 U.S.C. 154(b) by 14 days.

This patent is subject to a terminal disclaimer.

(21) Appl. No.: 13/015,021

(22) Filed: Jan. 27, 2011

(65) Prior Publication Data

US 2011/0132428 A1   Jun. 9, 2011

Related U.S. Application Data

(63) Continuation of application No. 12/715,543, filed on Mar. 2, 2010, now Pat. No. 7,902,460, which is a continuation of application No. 11/888,643, filed on Aug. 1, 2007, now Pat. No. 7,700,878.

(60) Provisional application No. 60/841,700, filed on Aug. 31, 2006, provisional application No. 60/849,633, filed on Oct. 5, 2006, provisional application No. 60/920,382, filed on Mar. 28, 2007.

(51) Int. Cl.
*H01B 7/06* (2006.01)

(52) U.S. Cl. ............... 174/72 A; 174/68.1; 174/68.3; 136/244; 136/245

(58) Field of Classification Search ............. 174/72 A, 174/68.1, 68.3, 135; 136/244, 245, 246, 136/251; 439/142, 571, 786, 796, 271
See application file for complete search history.

(56) References Cited

U.S. PATENT DOCUMENTS

| 3,562,020 A | 2/1971 | Blevins |
| 3,565,719 A | 2/1971 | Webb |
| 4,257,821 A | 3/1981 | Kelly et al. |

(Continued)

FOREIGN PATENT DOCUMENTS

EP   1 439 600   7/2004

(Continued)

OTHER PUBLICATIONS

International Preliminary Examination Report of International Application No. PCT/US2007/017146, report issued on Mar. 3, 2009.

(Continued)

*Primary Examiner* — Dhirubhai R Patel
(74) *Attorney, Agent, or Firm* — Hamilton, Brook, Smith and Reynolds, P.C.

(57) ABSTRACT

A buss bar strip for mounting to a solar panel to electrically connect to a series of electrical lines extending from solar cells. The buss bar strip can include a thin elongate flat flexible strip of insulative material having a longitudinal length. A predetermined pattern of elongate conductors can be longitudinally disposed on the insulative strip in at least two rows along the longitudinal length and electrically isolated from each other. Each conductor can have a predetermined position, length, and spacing from each other on the insulative strip for laterally electrically connecting to selected electrical lines from the solar cells at lateral electrical connection points located along the length of the conductor on exposed surfaces on the conductor.

30 Claims, 12 Drawing Sheets

U.S. PATENT DOCUMENTS

| | | | |
|---|---|---|---|
| 4,269,173 | A | 5/1981 | Krueger et al. |
| 4,283,106 | A | 8/1981 | Bunnell |
| 4,384,163 | A | 5/1983 | Rauschenbach et al. |
| 4,392,009 | A | 7/1983 | Napoli |
| 4,707,043 | A | 11/1987 | Reed |
| 6,034,319 | A | 3/2000 | Falbel |
| 6,113,439 | A | 9/2000 | Wagener |
| 6,160,215 | A | 12/2000 | Curtin |
| 6,437,236 | B2 | 8/2002 | Watanabe et al. |
| 6,443,145 | B1 | 9/2002 | Buron et al. |
| 6,449,082 | B1 | 9/2002 | Agrawal et al. |
| 6,620,645 | B2 | 9/2003 | Chandra et al. |
| 7,059,288 | B2 | 6/2006 | Merrick et al. |
| 7,188,963 | B2 | 3/2007 | Schofield et al. |
| 7,190,531 | B2 | 3/2007 | Dyson et al. |
| 7,960,650 | B2 * | 6/2011 | Richter et al. ............ 174/50 |
| 8,148,627 | B2 * | 4/2012 | Rose et al. ............ 136/244 |
| 2003/0013352 | A1 | 1/2003 | Machado |
| 2003/0103356 | A1 | 6/2003 | Hutchins et al. |
| 2004/0094194 | A1 | 5/2004 | Aldoretta et al. |
| 2005/0072455 | A1 | 4/2005 | Gerhardinger et al. |
| 2006/0180196 | A1 | 8/2006 | Lares et al. |
| 2006/0225781 | A1 | 10/2006 | Locher |
| 2007/0039611 | A1 | 2/2007 | Benvenuti |

FOREIGN PATENT DOCUMENTS

| | | |
|---|---|---|
| WO | WO 03/039193 A1 | 5/2003 |
| WO | WO 2004/105131 | 12/2004 |

OTHER PUBLICATIONS

Written Opinion of International Application No. PCT/US2007/017146, mailed on Dec. 20, 2007.

International Search Report or the Declaration of International Application No. PCT/US2007/017146, mailed on Dec. 20, 2007.

* cited by examiner

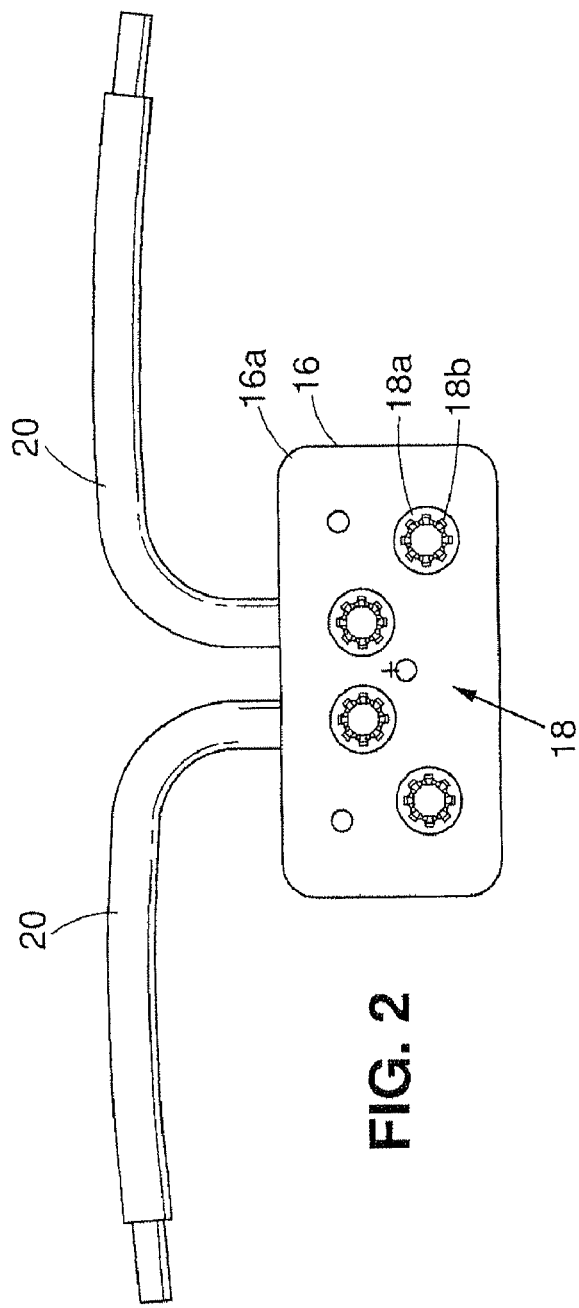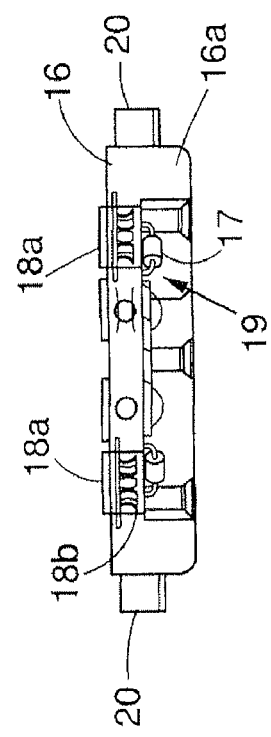

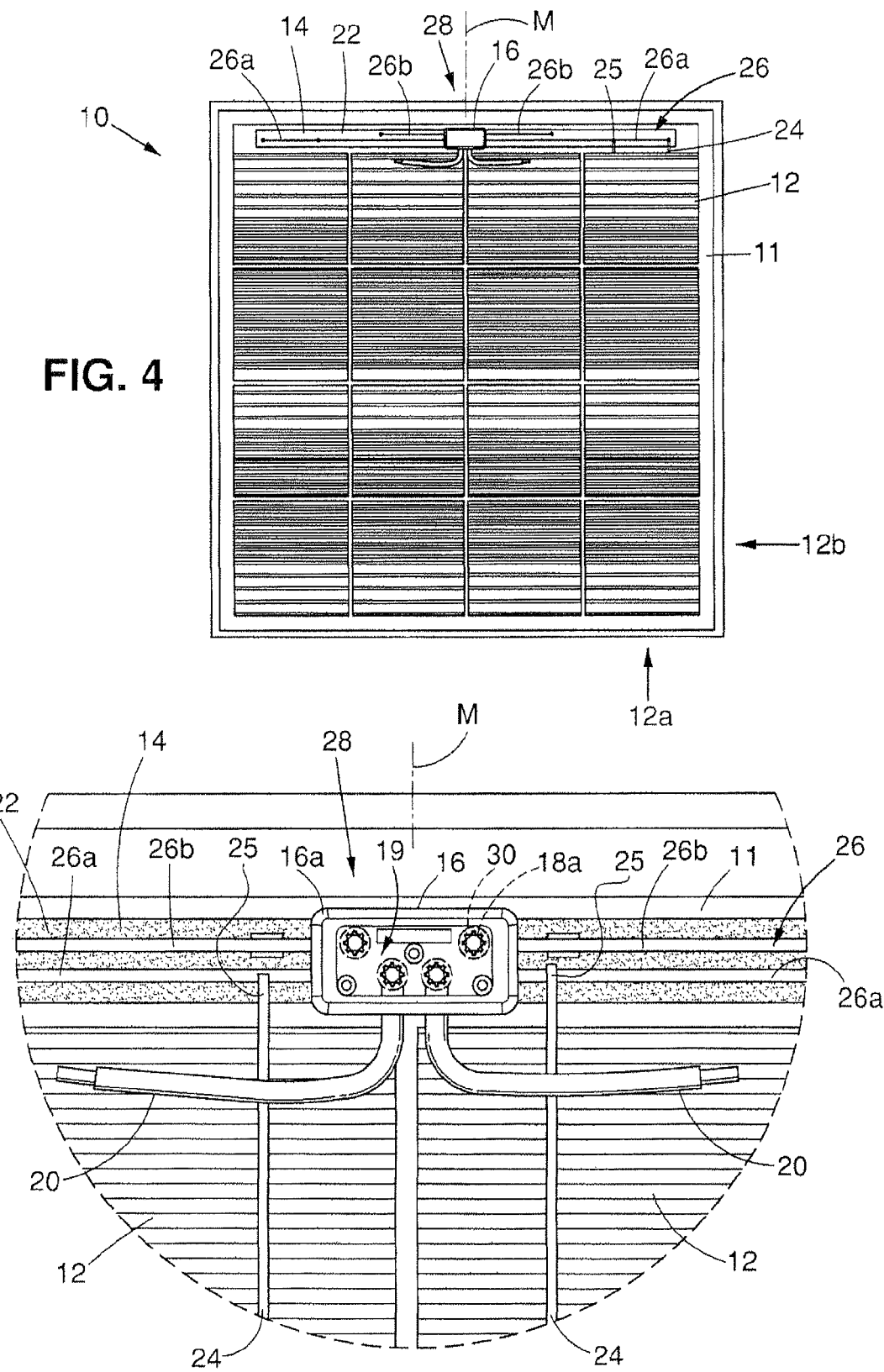

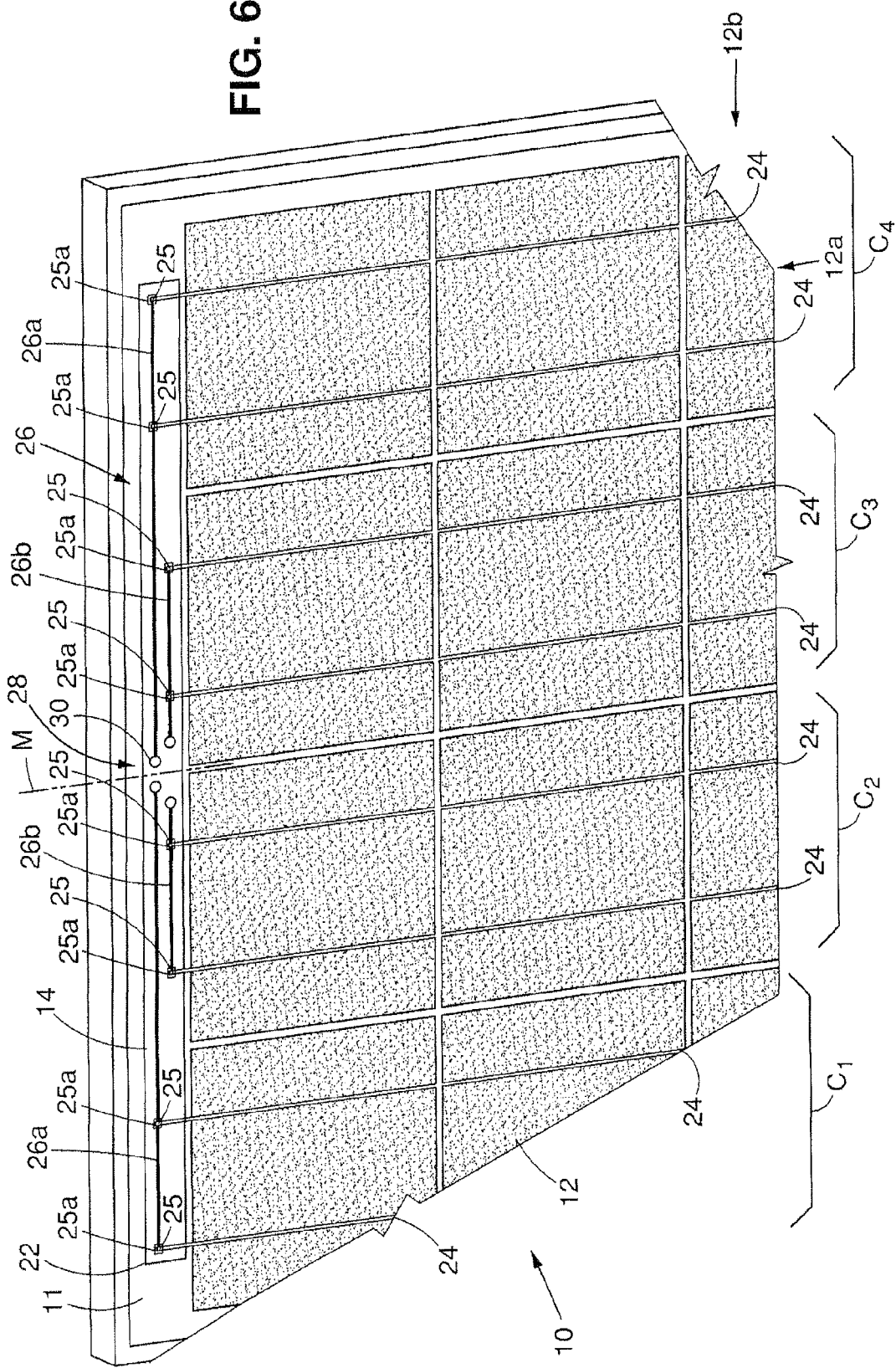

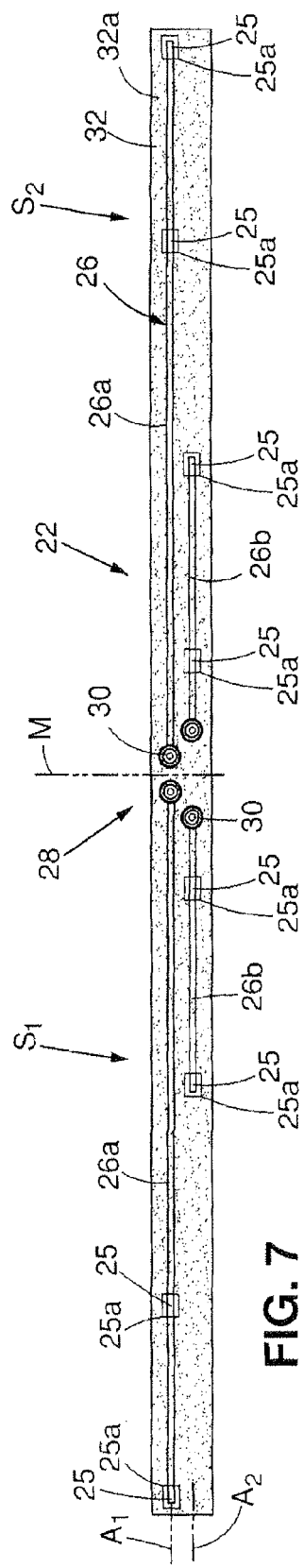

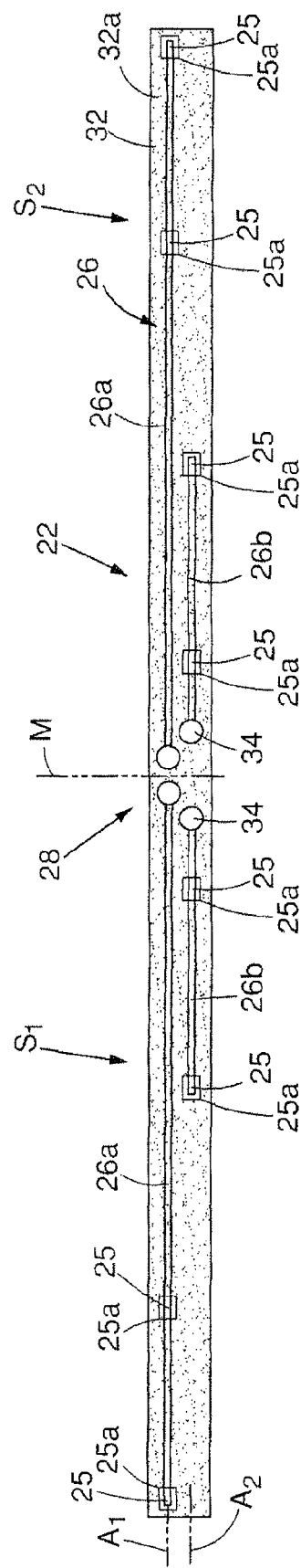
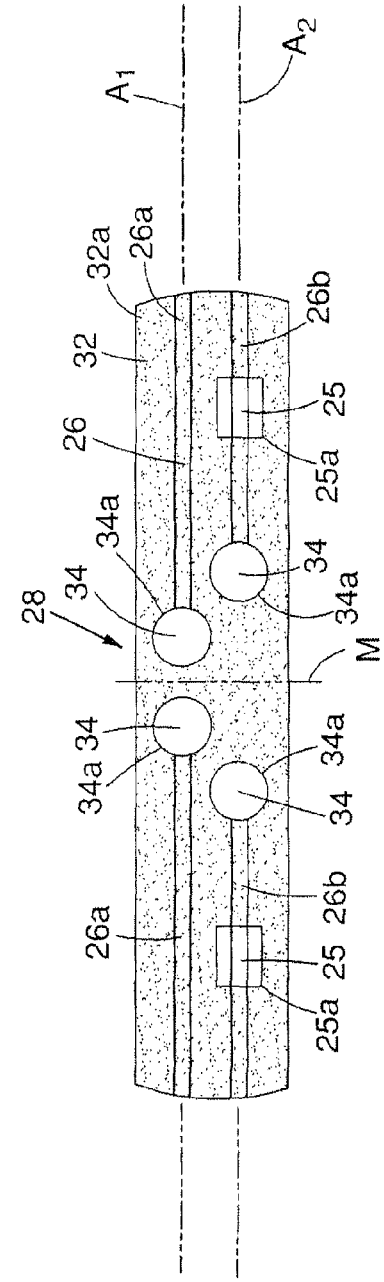

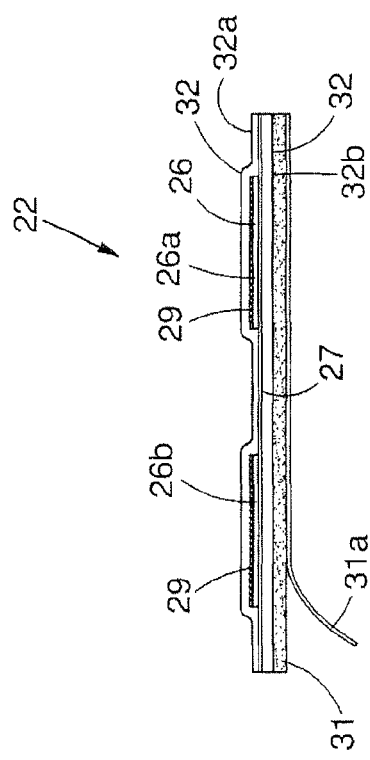
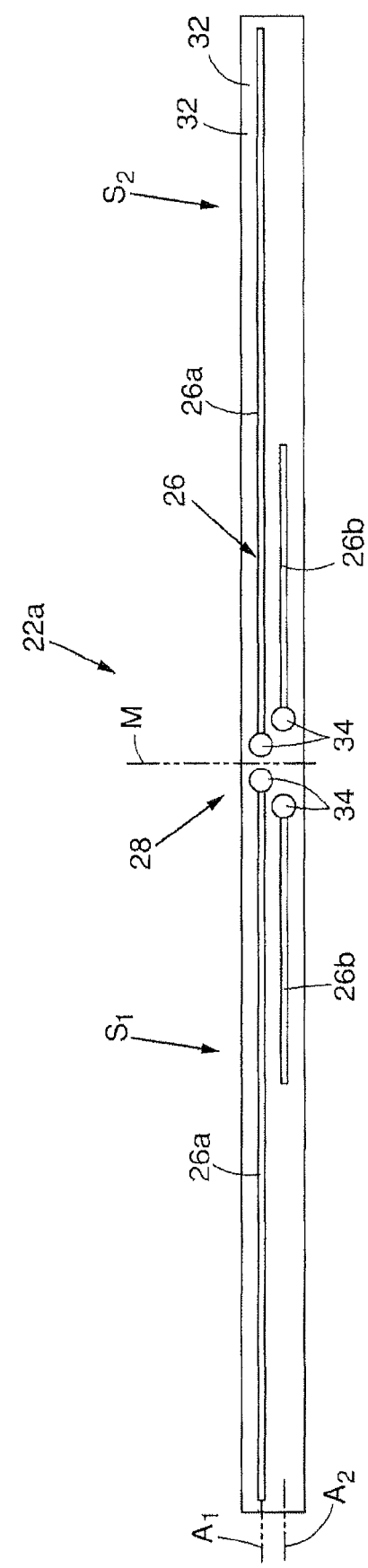

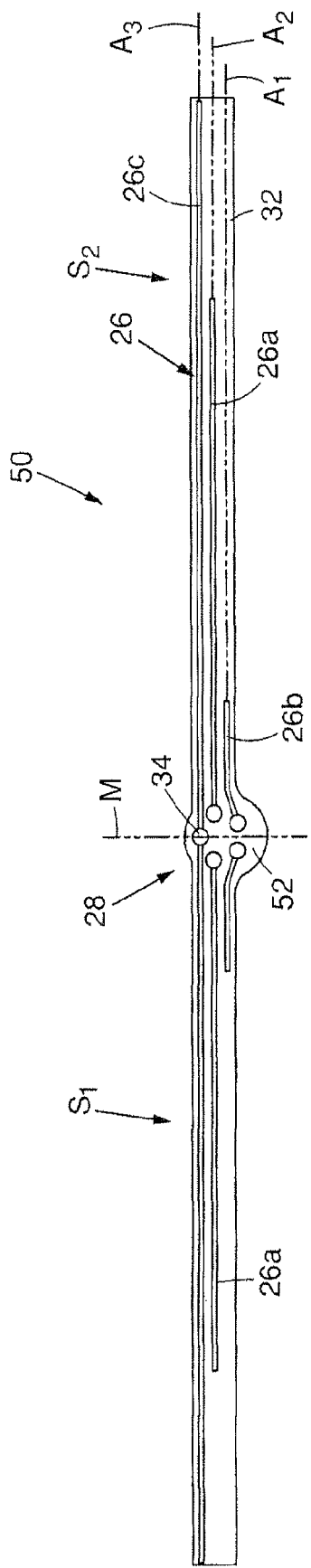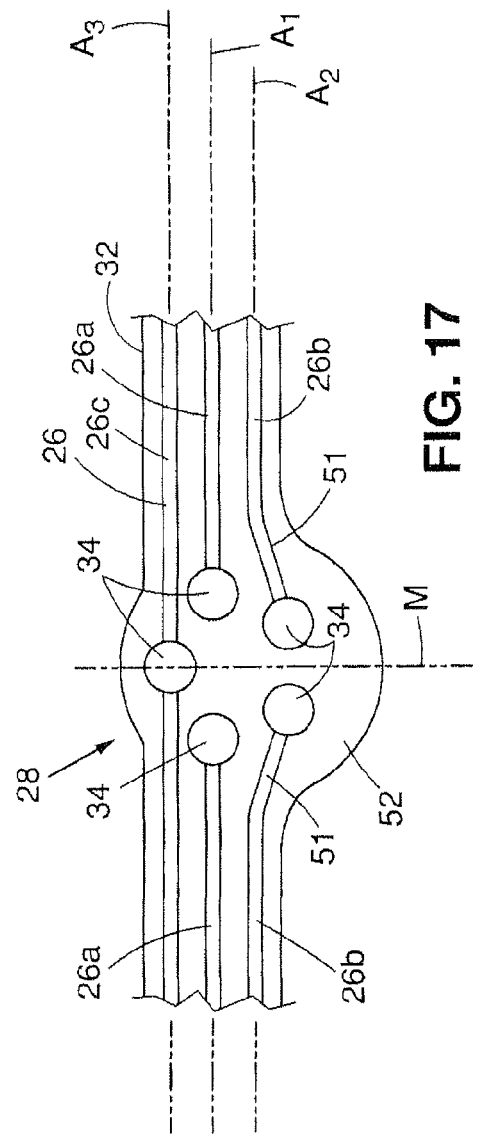

BUSS BAR STRIP

RELATED APPLICATIONS

This application is a continuation of U.S. application Ser. No. 12/715,543 filed Mar. 2, 2010 now U.S. Pat. No. 7,902,460, which is a continuation of Ser. No. 11/888,643, filed Aug. 1, 2007, now U.S. Pat. No. 7,700,878 issued Apr. 20, 2010, which claims the benefit of U.S. Provisional Application No. 60/841,700, filed on Aug. 31, 2006, U.S. Provisional Application No. 60/849,633, filed on Oct. 5, 2006 and U.S. Provisional Application No. 60/920,382, filed on Mar. 28, 2007. The entire teachings of the above applications are incorporated herein by reference.

BACKGROUND

Solar cells on a solar panel are typically electrically connected to a series of conductors located at the edge of the solar panel. The conductors are cut to length, installed within the solar panel, and soldered by hand to make the necessary electrical connections. This is a labor intensive process.

SUMMARY

The present invention provides a buss bar conductor strip or assembly which can reduce the amount of labor required for making electrical connections to the solar cells of a solar panel and to exterior cables.

The present invention can provide a buss bar strip for mounting to a solar panel to electrically connect to a series of electrical lines extending from solar cells. The buss bar strip can include a thin elongate flat flexible strip of insulative material having a longitudinal length. A predetermined pattern of elongate conductors can be longitudinally disposed on the insulative strip in at least two rows along the longitudinal length and electrically isolated from each other. Each conductor can have a predetermined position, length, and spacing from each other on the insulative strip for laterally electrically connecting to selected electrical lines from the solar cells at lateral electrical connection points located along the length of the conductor on exposed surfaces of the conductor.

In particular embodiments, the insulative strip can be formed of polymeric material. The series of elongate conductors can include generally flat ribbons of copper material laminated to the insulative strip. The flat ribbons of copper material can be coated with a layer of solder. At least some of the conductors can be longitudinally staggered. The pattern of conductors can include an electrical connection region for electrically connecting to an external device. The electrical connection region can be at a central location on the buss bar strip. Terminal pads can extend from the elongate conductors at the electrical connection region. A male circular connector can be soldered to each terminal pad. The series of elongate electrical conductors can include at least four elongate conductors extending from the electrical connection region. At least two can extend on one side and at least two can extend on an opposite side. On each side of the electrical connection region, one conductor can be shorter than the other. In some embodiments, the insulative strip can be a first insulative strip and the buss bar strip can further include a second thin elongate flat flexible strip of insulative material laminated to the first strip and over the pattern of conductors. The second strip can have access windows at selected locations for providing lateral electrical connection points on the conductors.

The present invention can also provide a buss bar strip for mounting to a solar panel to electrically connect to a series of electrical lines extending from solar cells. The buss bar strip can include a thin elongate flat flexible strip of insulative material having a longitudinal length. A predetermined pattern of elongate conductor means for conducting electricity can be longitudinally disposed on the insulative strip in at least two rows along the longitudinal length and electrically isolated from each other. Each conductor means for conducting electricity can have a predetermined position, length, and spacing from each other on the insulative strip for laterally electrically connecting to selected electrical lines from the solar cells at lateral electrical connection points located along the length of the conductor on exposed surfaces on the conductor.

The present invention can also provide a solar panel including a series of solar cells having a series of electrical lines extending therefrom at laterally spaced intervals. A buss bar strip can be mounted to the solar panel adjacent to the series of solar cells and electrically connected to the series of the electrical lines extending from the solar cells. The buss bar strip can include a thin elongate flat flexible strip of insulative material having a longitudinal length. A predetermined pattern of elongate conductors can be longitudinally disposed on the insulative strip in at least two rows along the longitudinal length and electrically isolated from each other. Each conductor can have a predetermined position, length, and spacing from each other on the insulative strip and can be laterally electrically connected to selected electrical lines from the solar cells at lateral electrical connection points located along the length of the conductor on exposed surfaces on the conductor.

In particular embodiments, the insulative strip can be formed of flexible polymeric material. The series of elongate conductors can include generally flat ribbons of copper material laminated to the insulative strip. The flat ribbons of copper material can be coated with a layer of solder. At least some of the conductors can be longitudinally staggered. The pattern of conductors can include an electrical connection region for electrically connecting to an external device. The electrical connection region can be at a central location on the buss bar strip. Terminal pads can extend from the elongate conductors at the electrical connection region. A male circular connector can be soldered to each terminal pad. The series of elongate electrical conductors can include at least four elongate conductors extending from the electrical connection region. At least two can extend on one side and at least two can extend on an opposite side. On each side of the electrical connection region, one conductor can be shorter than the other. Lamination materials can extend over the buss bar strip. The external device can be an electrical connector having female terminals that engage the male circular connectors. In some embodiments, the insulative strip can be a first insulative strip. The buss bar strip can include a second thin elongate flat flexible strip of insulative material laminated to the first strip and over the pattern of conductors. The second strip can have access windows at selected locations for providing lateral electrical connection points on the conductors.

The present invention can also provide a solar panel including a series of solar cells having a series of electrical lines extending therefrom at laterally spaced intervals. Buss bar strip means for conducting electricity can be mounted to the solar panel adjacent to the series of solar cells and electrically connected to the series of electrical lines extending from the solar cells. The buss bar strip can include a thin elongate flat flexible strip of insulative material having a longitudinal length. A predetermined pattern of elongate conductor means for conducting electricity can be longitudinally disposed on the insulative strip in at least two rows along the longitudinal length and electrically isolated from each other. Each conductor means for conducting electricity can have a predetermined position, length, and spacing from each other on the insulative strip and can be laterally electrically connected to selected electrical lines from the solar cells at lateral electrical connection points located along the length of the conductor on exposed surfaces on the conductor.

The present invention can also provide a method of forming a buss bar strip for mounting to a solar panel for electrically connecting to a series of electrical lines extending from solar cells. A thin elongate flat flexible strip of insulative material having a longitudinal length can be provided. A predetermined pattern of elongate conductors can be longitudinally disposed on the insulative strip in at least two rows along the longitudinal length and electrically isolated from each other. Each conductor can have a predetermined position, length, and spacing from each other on the insulative strip for laterally electrically connecting to selected electrical lines from the solar cells at lateral electrical connection points located along the length of the conductor on exposed surfaces of the conductor.

In particular embodiments, the insulative strip can be formed from flexible polymeric material. The series of elongate conductors can be formed from generally flat ribbons of copper material laminated to the insulative strip. The flat ribbons of copper material can be coated with a layer of solder. At least some of the conductors can be longitudinally staggered. The pattern of conductors can be formed to include an electrical connection region for electrically connecting to an external device. The electrical connection region can be positioned at a central location on the buss bar strip. Terminal pads can extend from the elongate conductors at the electrical connection region. A male circular connector can be soldered to each terminal pad. The series of elongate electrical conductors can include at least four elongate conductors extending from the electrical connection region. At least two conductors can extend on one side and at least two conductors can extend on an opposite side. On each side of the electrical connection, one conductor can be shorter than the other. In some embodiments, the insulative strip can be a first insulative strip. The buss bar strip can include a second thin elongate flat flexible strip of insulative material laminated to the first strip and over the pattern of conductors. The second strip can have access windows at selected locations for providing lateral electrical connection points on the conductors.

The present invention can also provide a method of electrically connecting a solar panel. The solar panel can include a series of solar cells having a series of electrical lines extending therefrom at laterally spaced intervals. A buss bar strip can be mounted to the solar panel adjacent to the series of solar cells. The buss bar strip can include a thin elongate flat flexible strip of insulative material having a longitudinal length. A predetermined pattern of elongate conductors can be longitudinally disposed on the insulative strip in at least two rows along the longitudinal length and electrically isolated from each other. Each conductor can have a predetermined position, length, and spacing from each other on the insulator strip and can be laterally electrically connected to selected electrical lines from the solar cells at lateral electrical connection points located along the length of the conductor on exposed surfaces on the conductor.

In particular embodiments, the insulative strip can be formed from flexible polymeric material. The series of elongate conductors can be formed from generally flat ribbons of copper material laminated to the insulative strip. The flat ribbons of copper material can be coated with a layer of solder. At least some of the conductors can be longitudinally staggered. The pattern of conductors can include an electrical connection region for electrically connecting to an external device. The electrical connection region can be positioned at a central location on the buss bar strip. Terminal pads can extend from the elongate conductors at the electrical connection region. A male circular connector can be soldered to each terminal pad. The series of elongate electrical conductors can include at least four elongate conductors extending from the electrical connection region. At least two conductors can extend on one side and at least two conductors can extend on an opposite side. On each side of the electrical connection region, one conductor can be shorter than the other. Lamination materials can be laminated over the buss bar strip. The external device can be an electrical connector having female terminals which can engage with the male circular connectors. In some embodiments, the insulative strip can be a first insulative strip. The buss bar strip can include a second thin elongate flat flexible strip of insulative material laminated to the first strip and over the patter of conductors. The second strip can have access windows at selected locations for providing lateral electrical connection points on the conductors.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 2 is a bottom view of the electrical connector.

FIG. 3 is a partial sectional view of the electrical connector.

FIG. 4 is a rear plan view of a solar panel with an electrical connector electrically connected to a buss bar conductor strip or assembly.

FIG. 5 is an enlarged view of the electrical connector connected to the buss bar strip of FIG. 4.

FIG. 6 is a plan view of a rear portion of a solar panel with the buss bar strip of FIG. 4 positioned in another orientation.

FIG. 7 is a plan view of the buss bar strip of FIG. 6.

FIG. 8 is an enlarged view of the electrical connector region of the buss bar strip of FIG. 7.

FIG. 9 is a side view of the buss bar strip of FIG. 7.

FIG. 10 is a plan view of the buss bar strip of FIG. 7 without male circular button connectors.

FIG. 11 is an enlarged view of the electrical connector region of FIG. 10.

FIG. 12 is a cross sectional view of the buss bar strip of FIG. 7.

FIG. 13 is a plan view of another embodiment of a buss bar conductor strip or assembly.

FIG. 16 is a plan view of yet another buss bar conductor strip or assembly.

FIG. 17 is an enlarged view of the electrical connector region of the buss bar strip of FIG. 16.

DETAILED DESCRIPTION

Figure 1:
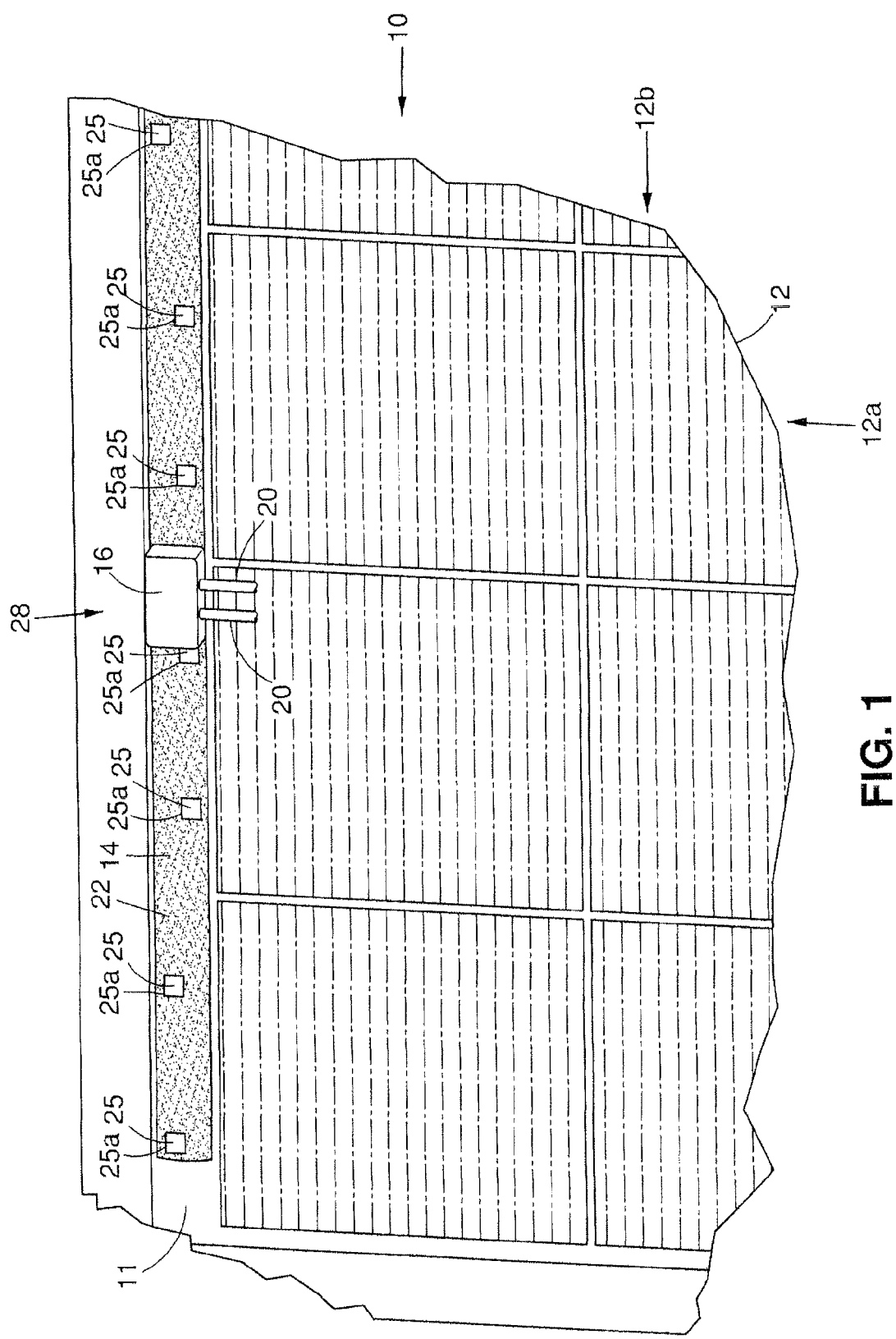
FIG. 1 is a plan view of a rear portion of a solar panel having an electrical connector attached to a buss bar conductor strip or assembly.

Referring to FIGS. 1-5, solar panel 10 has a series of solar cells 12 positioned side by side in a series of columns 12a and rows 12b. The solar cells 12 can be electrically connected to a series of electrical conductors 26 on a buss bar conductor strip or assembly 22 that can be positioned on the solar panel 10, typically on the rear or backside of the solar panel 10 at an electrical conductor region 14 along an edge of the solar panel 10 by a series of electrical lines, wires, cables or conductors 24 extending from the solar cells 12. The buss bar strip 22 can have an electrical connection region 28 with electrical terminal connectors 30 where an electrical connector or connector assembly 16 can be electrically connected to the buss bar strip 22. The electrical connectors 30 can be male circular button connectors (FIG. 9).

The body 16a of the electrical connector 16 can have an electrical connection region 18 which can include a series of electrical terminal connectors 18a, for example resilient female terminal circular socket connectors with resilient tabs 18b arranged in a circular pattern for engaging the male connectors 30. The male connectors 30 can have a generally planar circular base 30a and a post 30b (FIG. 9) with a circular cross section. The post 30b can be angled slightly outwards for maintaining engagement with the female connectors 18a. The female connectors 18a can be similar to those disclosed in U.S. Pat. No. 6,520,812, the contents of which are incorporated herein by reference in its entirety. In addition, the male connectors 30 can be similar to those disclosed in U.S. Pat. No. 6,475,043, the contents of which are incorporated herein by reference in its entirety. Alternatively, connectors 30 and 18a can be other suitable types of mating connectors, and the buss bar strip 22 can have female connectors and the electrical connector can have male connectors.

The electrical connector 16 can include electrical cables 20 extending from the body 16a for electrical connection to desired locations, including for example, connection to other solar panels in parallel or series. The electrical connector 16 can include circuitry 19 positioned within the body 16a capable of electrically bypassing damaged or shaded regions of the solar panel 10. Some embodiments can include bypass diodes 17. The electrical connector 16 can have various configurations and shapes, and can be similar to those described in U.S. patent application Ser. No. 11/803,017, filed May 11, 2007, the contents of which are incorporated herein by reference in its entirety. Alternatively, other suitable electrical connectors or connector assemblies can be employed. It is understood that the number and arrangement of connectors 30 and 18a can vary, depending upon the situation at hand.

Referring to FIGS. 4-6, the buss bar strip 22 can be presized with a predetermined series 26 of electrical conductors for electrical connection to a particular solar panel 10 in a desired configuration. The buss bar strip 22 can be positioned, secured, or adhered with adhesives onto the back of the solar panel 10 at the electrical conductor region 14 along the edge of the solar panel 10. The electrical lines 24 from the solar cells 12 can then be electrically connected or soldered to lateral electrical connection points 25 on the buss bar strip 22. The buss bar strip 22 can be generally flat or planar with a low profile and can be later laminated to the solar panel 10 under laminating materials which can include polymeric materials such as ethyl vinyl acetate (EVA), and can also include or be laminated with a backing such as a polyvinyl fluoride (PVF) backing or glass 11. A hole can be formed in the laminating materials around the electrical connection region 28 to provide access for the electrical connector 16.

Referring to FIGS. 7-12, the buss bar strip 22 can include a predetermined pattern or series 26 of elongate electrical conductors which can be laminated between two elongate strips 32 of electrically insulative material, such as thin flat flexible strips or ribbons of polymeric or plastic material. The insulative strips 32 can be formed of a variety of suitable materials, including for example, polyimide, polyvinyl acetate, etc. Flexibility of the insulative strips 32 can allow the buss bar strip 22 to conform to slightly uneven surfaces. The pattern 26 of conductors and the insulative strips 32 can be laminated together with a layer of adhesive 27. Alternatively, lamination can be accomplished by heat or ultrasonic sealing. The pattern 26 of conductors can be arranged spaced, sized and positioned in a predetermined manner to electrically connect the solar cells 12 of the solar panel 10 in a desired or particular manner to form multiple zones or circuits, typically at least two, so that particular zones can be bypassed if shaded or contain a damaged solar cell 12.

For example, the pattern 26 can include two rows with two long or elongate generally flat or low profile conductors 26a positioned or spaced apart in series within the insulative strips 32 along a first conductor axis $A_1$, and two short or elongate generally flat or low profile conductors 26b positioned or spaced apart in series within the insulative strips 32 along a second conductor axis $A_2$ that is parallel to axis $A_1$. Each of the conductors 26a and 26b can be positioned on opposite sides $S_1$ and $S_2$ of a central or middle axis M in a symmetrical manner, for example, in mirror image. The conductors 26a can extend longitudinally beyond conductors 26b in a staggered manner. The conductors 26a can longitudinally extend along axis $A_1$ from the electrical connection region 28 in opposite directions and terminate close to the ends of the insulative strips 32 on opposite sides $S_1$ and $S_2$ for laterally electrically connecting to electrical lines 24 of solar cells 12 in columns $C_1$ and $C_4$ (FIG. 6). The conductors 26b can longitudinally extend along axis $A_2$ from the electrical connection region 28 in opposite directions and terminate a shorter distance on opposite sides $S_1$ and $S_2$, for example, about the distance of a solar cell 12, for laterally electrically connecting to the electrical lines 24 of the solar cells 12 in columns $C_2$ and $C_3$. The electrical lines 24 can extend to the buss bar strip 22 in a transverse or orthogonal manner relative to conductors 26a and 26b. One of the insulative strips 32a, such as the upper or top insulative strip 32a, can include access openings or windows 25a to allow the electrical lines 24 to be electrically connected to the conductors 26a and 26b at selected lateral electrical connection points 25 on exposed surfaces of the conductors 26a and 26b, which can be at right angle junctions with the conductors 26a, 26b, along axes $A_1$, and $A_2$. The longitudinally staggered positioning of the spaced conductor pairs 26a and 26b relative to each other on each side $S_1$ and $S_2$ can allow electrical connection of columns $C_1$ through $C_4$ to conductors 26a and 26b in an organized and efficient manner, from the side or laterally, orthogonal or transverse relative to the buss bar strip 22, along the longitudinal length of the buss bar strip 22. The top insulative strip 32a having the access windows 25a can allow the buss bar strip 22 to be positioned either in the orientation depicted in FIG. 4, or the orientation depicted in FIG. 6. In the orientation depicted in FIG. 4, the electrical lines 24 can cross over conductors 26a to reach conductors 26b at lateral electrical connection points 25, since the top insulative strip 32a can electrically isolate the electrical lines 24 from the conductors 26a that are crossed. In some embodiments, more than one buss bar strip 22 can be employed for electrically connecting to the electrical lines 24 on one side of the solar panel 10, and can be stacked or positioned on top of each other. For example, the lower or bottom insulative strip 32b of one buss bar strip 22 can cover the top insulative strip 32a of another buss bar strip 22.

The conductors 26a and 26b can be formed of elongate metallic ribbon strips, for example, copper or copper alloy material, that are laminated to the insulative strips 32. The conductors 26a and 26b have a width and thickness or cross section that is suitable for carrying current and power from the solar cells 12. For example, the conductors 26a and 26b can be about 3 mm to 5 mm (0.11 inches to 0.2 inches) wide, and about 0.24 mm to 0.6 mm (about 0.009 inches to 0.024 inches) thick. The conductors 26a and 26b can be spaced apart from each other by about 6 mm (or about 0.25 inches). The conductors 26a and 26b can include a layer of solder 29 (FIG. 12) formed on one or both surfaces, for example, the top surface, to allow quick and easy soldering to the electrical lines 24. Alternatively, solder can be applied at the time of soldering. The insulative strip 32 can be low profile and can be about 0.004 inches thick and have a width ranging from about 1 to 2 inches. The edge of the buss bar strip 22 can be positioned about 0.1 inches away from the solar cells 12 when positioned on the solar panel 10. The dimensions can vary depending upon the situation at hand.

Referring to FIGS. 10 and 11, the conductors 26a and 26b can include terminal pads 34 positioned in the electrical connection region 28 for electrically connecting to an electrical connector 16. The terminal pads 34 can be generally circular in shape and can be integrally formed and positioned at the ends of the conductors 26a and 26b symmetrically about axis M. The base 30a of the male connectors 30 can be soldered to the terminal pads 34. The male connectors 30 can be in a desired pattern for electrically connecting to electrical connector 16 and can protrude through openings 34a in one insulative strip 32, for example the top insulative strip 32a. Alternatively, the terminal pads 34 can be located at intermediate portions of conductors 26a and 26b and can have other shapes, or can be merely a location on the conductors 26a and 26b for soldering to male connectors 30. In addition, electrical wires, lines or cables can be directly soldered to the terminal pads 34 or selected locations on conductors 26a and 26b for electrically connecting to a desired electrical connector, junction or location. It is understood that the positioning or pattern of the male connectors 30 and/or terminal pads 34 within the electrical connection region 28 can vary depending upon the configuration of the mating electrical connector 16, or type of electrical connection. Referring to FIG. 12, in some embodiments, the bottom insulative strip 32b can be covered by a pressure sensitive layer of adhesive 31 which can be covered by a layer of release paper 31a. The release paper 31a can be removed allowing the buss bar strip 22 to be adhered to the solar panel 10.

If desired, in some embodiments, the top insulative layer 32a can be omitted, for example, as seen in FIG. 13. Buss bar conductor strip or assembly 22a has only a single insulative strip 32, for example, a bottom insulative strip 32b, on which the pattern 26 of conductors is laminated. As a result, one side of the conductors 26a and 26a, for example the top, can be exposed for lateral electrical connection to electrical lines 24 at selected lateral electrical connection points 25. Longitudinal staggering or extension of the conductors 26a beyond conductors 26b provides lateral electrical connection access to electrical lines 24 to both conductors 26a and 26b. Male connectors 30 can be omitted as shown, or alternatively, male connectors 30 can be soldered to the terminal pads 34.

Figure 14:
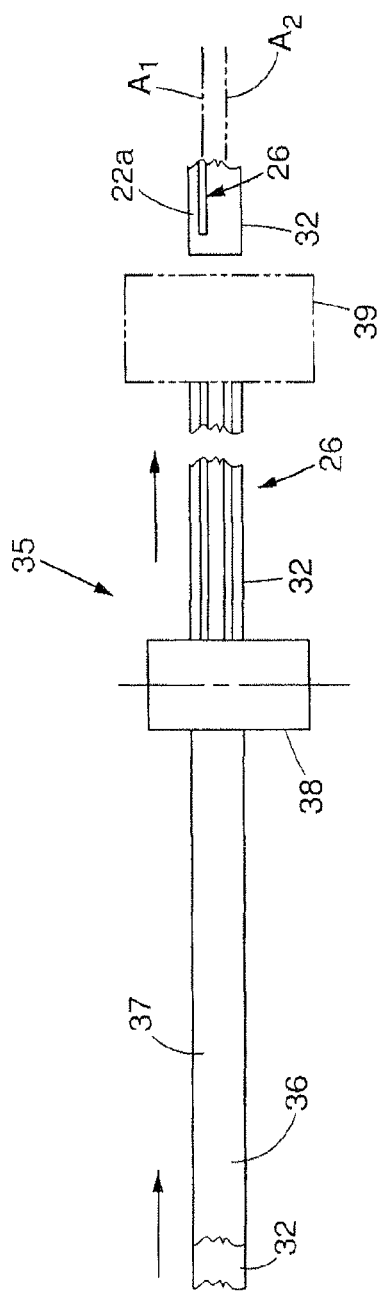
FIG. 14 is a schematic drawing of a method of manufacturing the buss bar strip of FIG. 13.

FIG. 14, depicts a process for forming a buss bar strip with an apparatus 35, for example, buss bar strip 22a. A laminate 37 including a strip of insulative material 32 and a metallic ribbon 36, for example solder clad copper or copper alloy material, can be fed into a die 38. The laminate 37 can include an adhesive 27 for bonding the strip 32 and ribbon 36 together. The die 38 can cut the ribbon 36 into a repeating predetermined pattern 26 of conductors without cutting the insulative strip 32. The pattern 26 of conductors can include terminal pads 34 if desired. The die 38 can be a rotary die, or alternatively, can be a vertical press die. The adhesive employed for the laminate 37 can be of a type that can allow the unwanted portions of the metallic ribbon 36 to be removed. Station 39 can cut the buss bar strip 22a to length. If desired, a top insulative strip 32a can be also laminated and windows 25 and 34a can be cut through one of the strips 32 to form buss bar strip 22. Furthermore, if desired, male connectors 30 can be soldered to the terminal pads 34. In other embodiments, the pattern 26 of conductors can be formed by other suitable means, for example, by deposition, printing or by directly applying metal ribbons or strips on the strip 32 of insulative material in the desired pattern 26.

Figure 15:
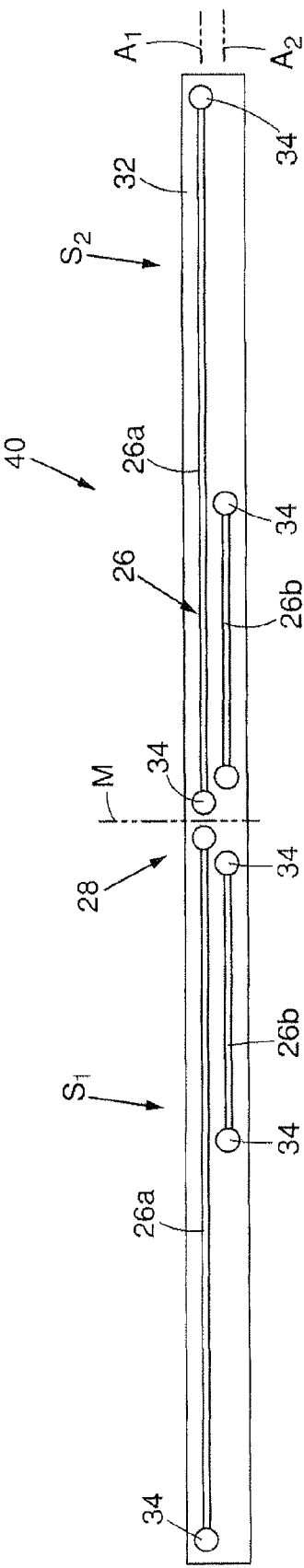
FIG. 15 is a plan view of another embodiment of a buss bar conductor strip or assembly.

Referring to FIG. 15, buss bar conductor strip or assembly 40 differs from buss bar strip 22a in that buss bar strip 40 includes conductors 26a and 26b with terminal pads 34 on opposite ends. The terminal pads 34 can allow electrical wires, lines or cables, and/or male connectors 30 to be soldered to selected terminal pads 34. The additional terminal pads 34 can allow the buss bar strip 40 to be electrically connected to a solar panel 10 in a different manner than buss bar strip 22a to form different electrical circuit zones on solar panel 10, or to provide different features or options. Electrical lines 24 from the solar cells 12 can lie on and be laterally soldered to desired intersecting conductors 26a and 26b. Typically, the electrical lines 24 are connected to conductors 26b close to center of the buss bar strip 40, and to conductors 26a near the ends of the buss bar strip 40. If desired, a top insulative strip 32a can be included.

Referring to FIGS. 16 and 17, buss bar conductor strip or assembly 50 differs from buss bar strip 22a in that the pattern 26 of conductors can include a series of conductors 26a, 26b and 26c positioned in a spaced manner generally adjacent to each other in rows along three parallel longitudinal axes $A_1$, $A_2$ and $A_3$, and symmetrically about central axis M. The conductor 26c can be one continuous or single conductor generally extending the longitudinal length of the buss bar strip 50. The conductor 26c and the two pairs of conductors 26a and 26b each can have a terminal pad 34 located in the electrical connector region 28, resulting for example, in a total of five terminal pads 34. The insulative strip 32 can include a widened portion 52 centered about axis M at about the midpoint of the buss bar strip 50, which can be, for example, generally circular in shape as shown. In other embodiments, the widened portion 52 can have other suitable shapes, for example, rectangular, polygonal, nonsymmetrical curves, or combinations thereof. The widened portion 52 can allow the terminal pads 34 of the electrical connection region 28 to be spaced apart from each other in the desired spacing and pattern for electrically connecting to a desired associated electrical connection or mating electrical connector or connector assembly. The conductors 26b can have angled, bent or redirected legs 51 for positioning the associated terminal pads 34 in the desired locations or patterns. Male connectors 30 can be soldered to the terminal pads 34 if desired. The buss bar strip 50 can be electrically connected to a solar panel 10 in a similar manner as buss bar assembly 22a if only conductors 26a and 26b are employed, or can be connected with additional circuitry features or options or zones employing conductor 26c and its associated terminal pad 34.

Figure 18:
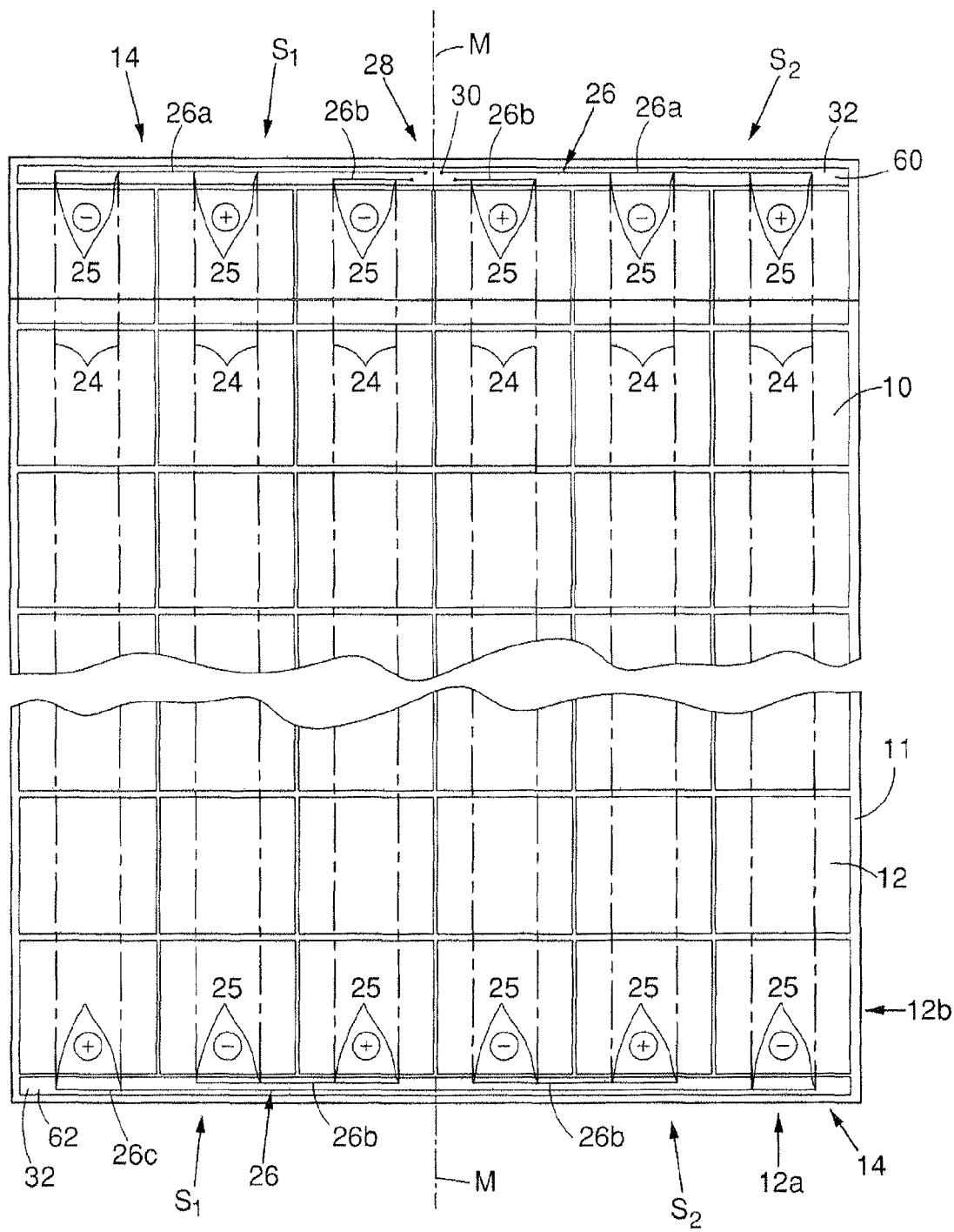
FIG. 18 is a rear plan view of another solar panel having embodiments of buss bar conductor strips or assemblies.

Referring to FIG. 18, solar panel 10 is shown to have six columns 12a of solar cells 12 in comparison to the four columns 12a, depicted in FIGS. 1, 4 and 6, and includes two buss bar conductor strips or assemblies 60 and 62 at opposite ends of the solar panel 10. Buss bar strip 60 is similar to buss bar strip 22a, differing in that buss bar strip 60 and conductors 26a can be longer in length in order for each conductor 26a to laterally electrically connect to electrical lines 24 from an additional column 12a of solar cells 12. The buss bar strip 62 can laterally electrically connect to electrical lines 24 from the solar cells 12 to complete the circuit at the opposite end of the solar panel 10 in the desired circuit configuration. Buss bar assembly 62 does not have an electrical connection region 28 and can have a pattern 26 of electrical conductors with a single long conductor 26c and two spaced shorter conductors 26b in series to each other and parallel to the conductor 26c on sides $S_1$ and $S_2$, symmetrically about axis M.

Depending upon the desired manner of electrically connecting the solar cells 12, and the internal circuitry of the electrical connector that mates or connects to the male connectors 30 at the electrical connection region 28, buss bar strips 60 and 62 can have different configurations than shown. The buss bar strips 60 and 62 can be adhered to the back of solar panel 10 on opposite sides of the solar cells 12 at electrical conductor regions 14 and electrically connected in the desired or predetermined manner to electrical lines 24 at electrical connector points 25 in a lateral, orthogonal or transverse manner. The buss bar assemblies 60 and 62 and the back of the solar cells 12 can be covered and sealed with laminating materials and glass 11.

Figure 19:
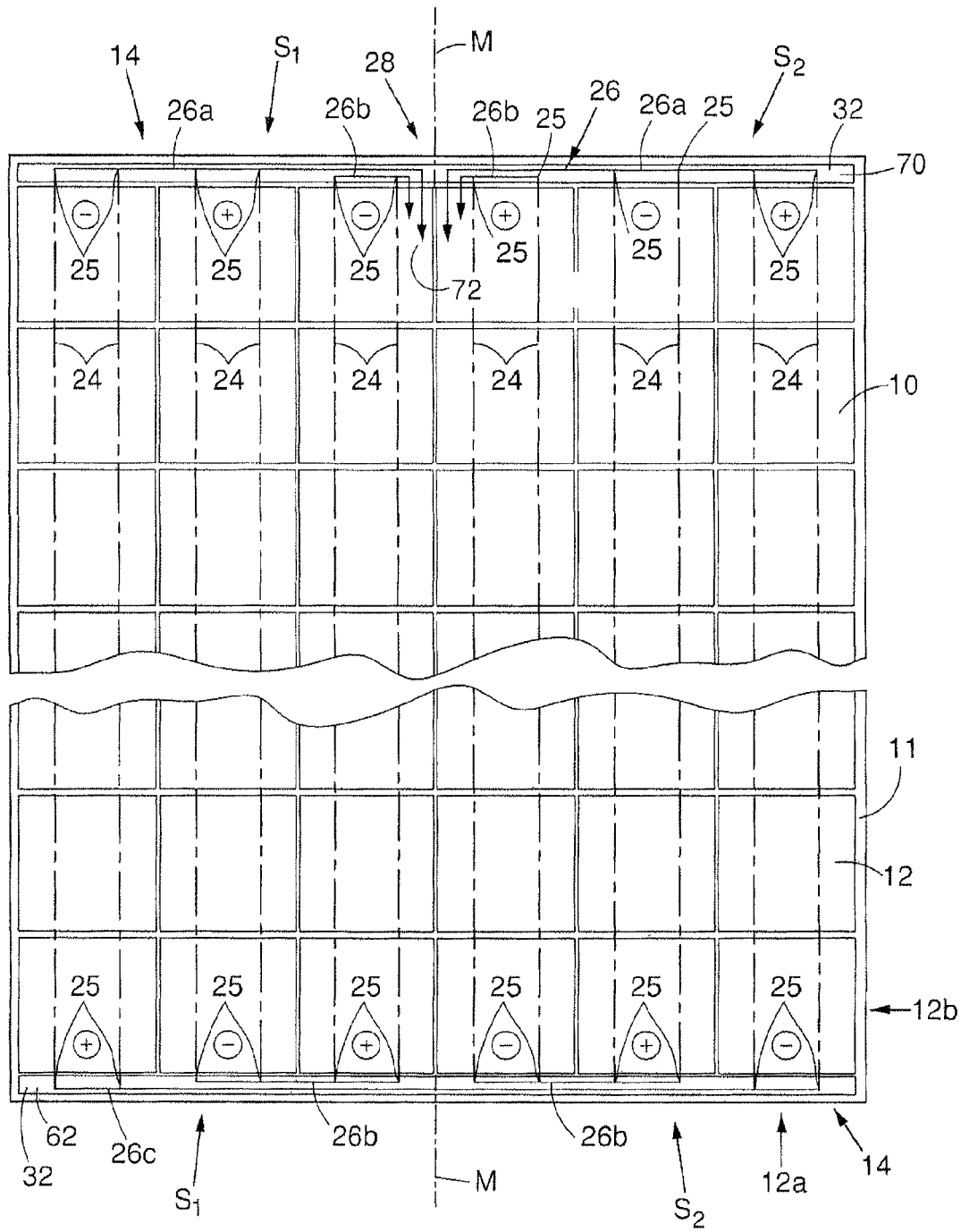
FIG. 19 is a rear plan view of another solar panel having other embodiments of buss bar conductor strips or assemblies.

Referring to FIG. 19, a buss bar strip or assembly 70 can be mounted to a solar panel 10 and electrically connected to the electrical lines 24. Buss bar assembly 70 differs from buss bar assembly 60 in that electrical leads, cables, wires or conductors 72 can be electrically connected or soldered to the conductors 26a and 26b at the electrical connection region 28 for electrically connecting to a junction box.

Figure 20:
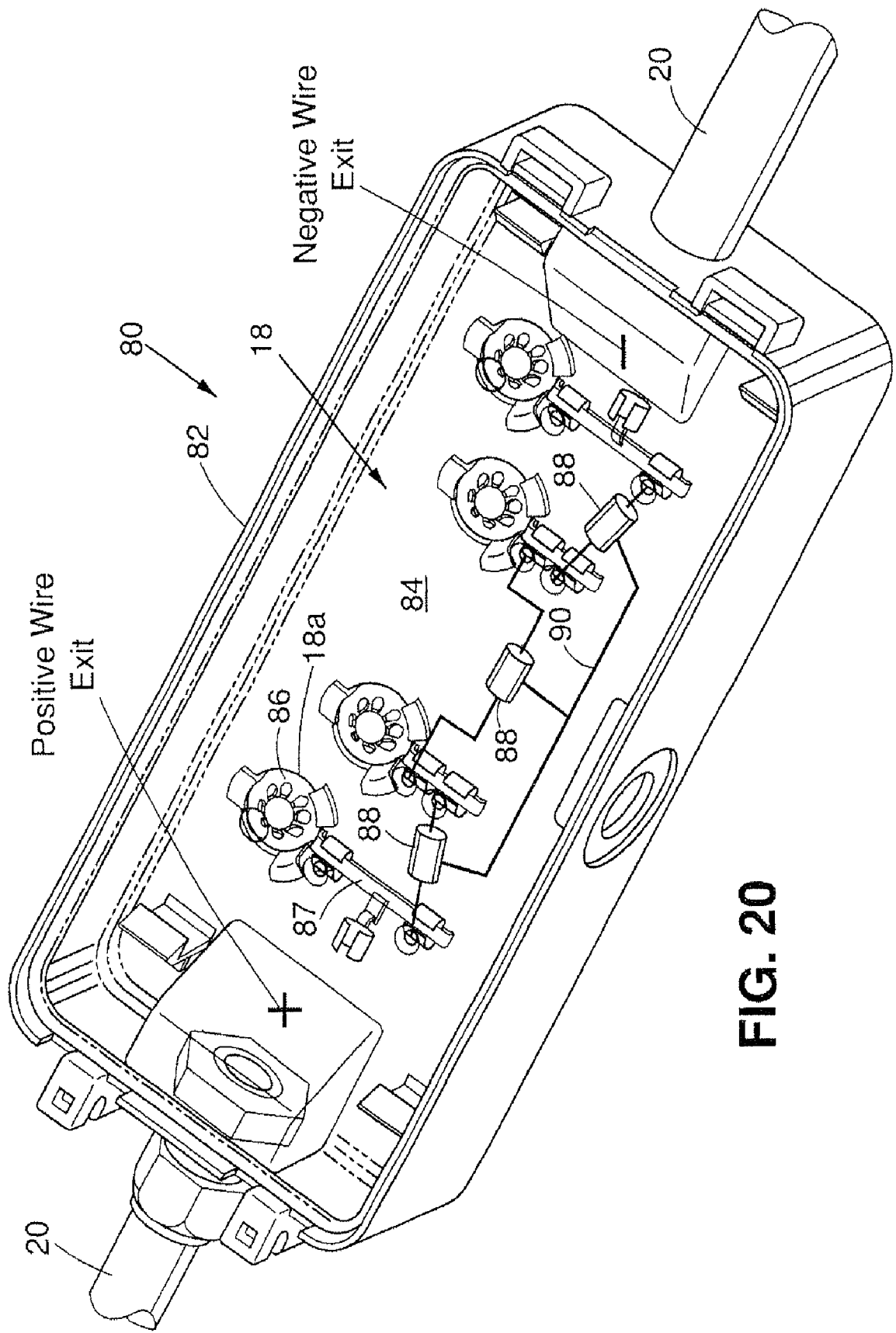
FIG. 20 is a perspective view of an interior of another embodiment of an electrical connector with some components removed for clarity.

Referring to FIG. 20, electrical connector or connector assembly 80 is an example of another embodiment of an electrical connector for electrically connecting to the electrical connection region 28 on a buss bar strip or assembly. Electrical connection region 18 of the electrical connector 80 can include a series of terminals 86 having female electrical connectors 18a. The terminals 86 can have conductors 87 which can be connected together in a desired circuit 90 including diodes 88, for bypassing selected regions of the solar panel 10 containing solar cells 12 that are shaded or damaged. The electrical connector 80 can also include circuitry if desired for additional functions or features. The electrical connectors 18a can be electrically connected to cables 20. It is understood that the configurations of the electrical connectors or connector assemblies and buss bar conductor strips or assemblies vary depending upon the size of the solar panel 10, and the desired manner of electrically connecting the solar cells 12 together. For example, the number and pattern of connectors 18a and 30 can vary.

While this invention has been particularly shown and described with references to example embodiments thereof, it will be understood by those skilled in the art that various changes in form and details may be made therein without departing from the scope of the invention encompassed by the appended claims.

For example, features of the buss bar strips and electrical connectors described, can be omitted or combined together. In addition, buss bar strips having one insulative strip 32 can also be stacked. Furthermore, although the conductors on the buss bar strips have been shown to be in a generally symmetrical pattern, in some embodiments, the conductors can be arranged in a nonsymmetrical manner and the electrical connection region 28 can be at non central locations, for example, at or near one end. A top insulative strip 32a with appropriately positioned access windows 2a can allow such non symmetrical arrangements or can allow the use of parallel conductors of the same length. Also, the pattern of conductors can be embedded in the insulative strip(s).

What is claimed is:

1. A solar panel comprising:
a series of solar cells having a series of electrical lines extending therefrom at laterally spaced intervals; and
a buss bar assembly mounted to the solar panel adjacent to the series of solar cells and electrically connected to the series of electrical lines extending from the solar cells, the buss bar assembly comprising at least one elongate conductor laterally electrically connected to selected said electrical lines from the solar cells at lateral electrical connection points located along a length of the at least one conductor on exposed surfaces on the at least one conductor, the at least one conductor including an electrical connection region for electrically connecting to an external device, at least one male circular connector being soldered to the electrical connection region.

2. The solar panel of claim 1 in which the at least one conductor comprises a generally flat metallic ribbon.

3. The solar panel of claim 2 in which the generally flat metallic ribbon is coated with a layer of solder.

4. The solar panel of claim 1 in which the buss bar assembly further comprises at least two spaced elongate conductors extending along a common longitudinal axis.

5. The solar panel of claim 4 further comprising lamination materials extending over the buss bar assembly.

6. The solar panel of claim 1 in which the buss bar assembly further comprises a thin elongate flat flexible strip of insulative material having a longitudinal length, and the at least one conductor being longitudinally disposed on the insulative strip.

7. The solar panel of claim 6 in which the buss bar assembly includes a predetermined pattern of elongate conductors longitudinally disposed on the insulative strip along the longitudinal length and electrically isolated from each other, each of said conductors having a predetermined position, length and spacing from each other on the insulative strip.

8. The solar panel of claim 7 in which the insulative strip is formed of flexible polymeric material.

9. The solar panel of claim 1 in which the external device is an electrical connector having at least one female terminal that engages the at least one male circular connector.

10. A buss bar strip for mounting to a solar panel to electrically connect to a series of electrical lines extending from solar cells comprising:
at least one elongate conductor for laterally electrically connecting to selected said electrical lines from the solar cells at lateral electrical connection points located along a length of the at least one conductor on exposed surfaces on the at least one conductor, the at least one conductor including an electrical connection region for electrically connecting to an external device, at least one male circular connector being soldered to the electrical connection region.

11. The buss bar strip of claim 10 in which the at least one conductor comprises a generally flat metallic ribbon.

12. The buss bar strip of claim 11 in which the flat metallic ribbon is coated with a layer of solder.

13. The bus bar strip of claim 10 further comprising a thin elongate flat flexible strip of insulative material having a longitudinal length, and the at least one conductor being longitudinally disposed on the insulative strip.

14. The buss bar strip of claim 13 in which the insulative strip is formed of flexible polymeric material.

15. The buss bar strip of claim 14 further comprising at least two spaced elongate conductors extending along a common longitudinal axis.

16. A method of electrically connecting a solar panel, the solar panel including a series of solar cells having a series of electrical lines extending therefrom at laterally spaced intervals, the method comprising:
   mounting a buss bar strip to the solar panel adjacent to the series of solar cells, the buss bar assembly comprising at least one elongate conductor laterally electrically connected to selected said electrical lines from the solar cells at lateral electrical connection points located along a length of the at least one conductor on exposed surfaces on the at least one conductor, the at least one conductor including an electrical connection region for electrically connecting to an external device, at least one male circular connector being soldered to the electrical connector region.

17. The method of claim 16 further comprising forming the at least one conductor from a generally flat metallic ribbon.

18. The method of claim 17 further comprising providing the generally flat metallic ribbon with a layer of solder.

19. The method of claim 16 in which the buss bar assembly further comprises at least two spaced elongate conductors, the method further comprising extending the conductors along a common longitudinal axis.

20. The method of claim 19 further comprising laminating lamination materials over the buss bar assembly.

21. The method of claim 16 further comprising providing the buss bar assembly with a thin elongate flat flexible strip of insulative material having a longitudinal length, and the at least one conductor being longitudinally disposed on the insulative strip.

22. The method of claim 21 further comprising providing a predetermined pattern of elongate conductors longitudinally disposed on the insulative strip along the longitudinal length and electrically isolated from each other, each of said conductors having a predetermined position, length and spacing from each other on the insulative strip.

23. The method of claim 22 further comprising forming the insulative strip from flexible polymeric material.

24. The method of claim 23 in which the external device is an electrical connector having at least one female terminal, the method further comprising engaging the at least one female terminal of the electrical connector with the at least one male circular connector.

25. A method of forming a buss bar strip for mounting to a solar panel for electrically connecting to a series of electrical lines extending from solar cells comprising:
   forming at least one elongate conductor for laterally electrically connecting to selected said electrical lines from the solar cells at lateral electrical connection points located along a length of each of the at least one conductor on exposed surfaces on the at least one conductor;
   forming the at least one conductor to include an electrical connection region for electrically connecting to an external device; and
   soldering at least one male circular connector to the electrical connection region.

26. The method of claim 25 further comprising forming the at least one conductor from a generally flat metallic ribbon.

27. The method of claim 26 further comprising providing the flat metallic ribbon with a layer of solder.

28. The method of claim 25 further comprising providing a thin elongate flat flexible strip of insulative material having a longitudinal length, and the at least one conductor being longitudinally disposed on the insulative strip.

29. The method of claim 28 further comprising forming the insulative strip from flexible polymeric material.

30. The method of claim 29 in which the bus bar strip further comprises at least two spaced elongate conductors, the method further comprising extending the conductors along a common longitudinal axis.

\* \* \* \* \*